(12) United States Patent
LaBerge

(10) Patent No.: US 6,714,460 B2
(45) Date of Patent: Mar. 30, 2004

(54) SYSTEM AND METHOD FOR MULTIPLEXING DATA AND DATA MASKING INFORMATION ON A DATA BUS OF A MEMORY DEVICE

(75) Inventor: Paul A. LaBerge, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 165 days.

(21) Appl. No.: 10/081,653

(22) Filed: Feb. 21, 2002

(65) Prior Publication Data

US 2003/0156465 A1 Aug. 21, 2003

(51) Int. Cl.$^7$ ................................................ G11C 7/00
(52) U.S. Cl. .................................... 365/189.01; 365/195
(58) Field of Search ............................. 365/189.01, 195, 365/230.06, 235

(56) References Cited

U.S. PATENT DOCUMENTS

| | | | | |
|---|---|---|---|---|
| 5,539,430 A | * | 7/1996 | Priem et al. | 345/545 |
| 5,657,287 A | * | 8/1997 | McLaury et al. | 365/230.01 |
| 6,011,727 A | * | 1/2000 | Merritt et al. | 365/189.02 |
| 6,269,103 B1 | | 7/2001 | Laturell | 370/458 |

* cited by examiner

*Primary Examiner*—Vu A. Le
(74) *Attorney, Agent, or Firm*—Dorsey & Whitney LLP

(57) ABSTRACT

A method and system masking data being written to a memory device having a data bus. One method includes applying masking data on the data bus, storing the masking data in the memory device, applying write data on the data bus, storing the write data in the memory device, and applying the stored masking data to mask the stored write data.

53 Claims, 4 Drawing Sheets

SYSTEM AND METHOD FOR MULTIPLEXING DATA AND DATA MASKING INFORMATION ON A DATA BUS OF A MEMORY DEVICE

TECHNICAL FIELD

The present invention relates generally to integrated circuits, and more specifically to the masking of data being written to an integrated circuit such as a memory device.

BACKGROUND OF THE INVENTION

A semiconductor integrated circuit device, such as a dynamic random access memory (DRAM), includes a die or chip, which is a small piece of semiconductor material in which electronic circuitry (i.e., integrated circuit) is formed. The chip is physically and electrically attached to a chip package, which is a protective container, such as a plastic dual-in-line package (DIP) or printed circuit board to which the chip is coupled. The chip is typically electrically coupled the chip package by forming electrical connections between bonding pads on the chip and leads or pins on the chip package.

As the functionality of integrated circuit devices increases, the complexity of the electronic circuitry typically increases along with the required number of pins on the chip package required to support this increased functionality. For example, as the storage capacity of a DRAM increases, more address pins are required to access the data stored in the DRAM. Each segment of data is stored in a unique address in the DRAM, and as the amount of data and thereby the number of segments of data increases, the number of unique addresses must also increase, which requires more address pins. As the number of pins increases, the cost of the DRAM or other integrated circuit device also increases due to the physical formation of additional pins on the chip package as well as the increased manufacturing and testing costs due to the interconnection of more bonding pads on the chip and pins on the chip package.

In a typical application, a plurality of DRAMs are mounted on a circuit board to form a memory module. Each DRAM receives address and control signals through address and control terminals on the circuit board, and has a data bus coupled to a corresponding data terminals on the circuit board. Typically, the memory module has a data bus that is M bits wide, where M is an integer multiple of N, which is the width of the data bus of each DRAM. Each DRAM on the module provides N of the M bits in response to common address and control signals applied to all DRAMs on the module. For example, a typical memory module includes 8 DRAMs each having an 8 bit wide data bus to form a 64 bit wide data bus on the memory module. Another typical memory module includes 9 DRAMs, each having an 8 bit wide data bus to form a 72 bit wide data bus on the memory module with 8 bits that function as error checking and correction bits. As with individual DRAMs, as the number of terminals on the memory module increases, the cost of the memory module increases due to the physical formation of more terminals, increased complexity in informing electrical interconnectors on the circuit board, and increased manufacturing and test costs.

FIG. 1 is a simplified block diagram of a DRAM 100 including an address decoder 102 that receives address bits A0–AX on an address bus ADDR and decodes these address bits and applies decoded address signals 104 to a memory-cell array 106. The memory-cell array 106 includes a plurality of memory cells (not shown) arranged in rows and columns, each memory cell storing a bit of data. The data stored in the memory cells is accessed in response to the decoded address signals 104 from the address decoder 102. A read/write circuit 108 is coupled to the memory-cell array 106 through an internal data path 110 and is coupled to an external data bus DATA of the DRAM 100. In the example of FIG. 1, the data bus DATA includes 8 external terminals over which data bits DQ0–7 are transferred to and from the DRAM 100, and also includes a terminal over which a data masking signal DM is received during write operations. The read/write circuit 108 masks data bits DQ0–7 in response to the data masking signal DM, as will be described a more detail below.

The data bus DATA can include more of fewer terminals, such as 32, 16, or 4 terminals to transfer a corresponding number of data bits. The DRAM 100 also includes control logic 112 that receives a plurality of control signals applied on an external control bus CONT. In response to the control signals, the control logic 112 generates a plurality of control and timing signals 114 to control the timing and operation of the address decoder 102, memory-cell array 106, and read/write circuit 108 during operation of the DRAM 100.

In operation, an external circuit (not shown) such as a memory controller applies address, control, and data signals to the DRAM 100 over the address bus ADDR, control bus CONT, and data bus DATA, respectively, to control the operation of the DRAM. During read operations, the external circuit applies a read command to the DRAM 100 in the form of appropriate address signals on the address bus ADDR and control signals on the control bus CONT. In response to the applied address signals, the address decoder 102 accesses addressed memory cells in the memory-cell array 106 and applies the read data stored in the addressed memory cells over the internal data path 110 to the read/write circuit 108 which, in turn, places the read data on the data bus DATA as read data bits DQ0–7. The control logic 112 generates the appropriate control and timing signals 114 to control the address decoder 102, memory-cell array 106, and read/write circuit 108 during the read operation.

During write operations, the external circuit applies a write command to the DRAM 100 in the form of appropriate address signals and control signals on the ADDR and CONT buses, respectively, and also applies write data bits DQ0–7 on the data bus DATA. Once again, in response to the applied address signals, the address decoder 102 accesses the addressed memory cells in the memory-cell array 106. The read/write circuit 108 transfers the applied write data bits DQ0–7 over the internal data path 110 and into the addressed memory cells in the memory-cell array 106. The control logic 112 operates during write operations to generate the appropriate control and timing signals 114 to control the address decoder 102, memory-cell array 106, and read/write circuit 108.

Also during write operations, the external circuit may activate the data masking signal DM to mask the write data bits DQ0–7. When the data masking signal DM is activated, the data bits DQ0–7 are not written into or are "masked" from the corresponding addressed memory cells in the array 106, as will be appreciated by those skilled in the art. When the data masking signal DM is deactivated, the write data bits DQ0–7 are written into the corresponding addressed memory cells in array 106.

The masking of data being written to the DRAM 100 using the data masking signal DM is used frequently in some applications while being used seldom if at all in other applications. For example, 8 or 9 of the DRAMs 100 are many times combined to form a memory module having a 64 or 72 bit wide data bus as previously described. Each DRAM 100 on the memory module receives a corresponding DM signal from an external controller, such as a memory controller or processor, which the controller selectively activates to mask selected bytes (i.e., 8 bits) of write data on the data bus. When the memory module is being used in graphics applications such as on a video card in a personal computer, the external controller typically frequently activates the data masking signals DM to mask selected bytes of write data on the data bus. The data masking functionality of the DRAMs 100 is particularly useful in such graphics applications where, for example, a background color may not be changing and thus the data corresponding to the background color will be masked while other data is changing and is thus not masked. In other applications, such as when the memory module is being used as part of system memory in a personal computer, the masking of write data via the data masking signals DM is seldom done.

In each DRAM 100, the data masking signal DM requires a separate external pin, and, as previously mentioned, such external pins increase the cost of the memory module as well as the cost of individual DRAMs 100. Moreover, the numbers of the memory modules containing such DRAMs 100 that will be used as system memory in personal computers is greater than the number of memory modules that will be used in graphics applications. As a result, the data masking signals DM of the DRAMs 100 will not be used in most applications but still consume pins on the memory module. The data masking signals DM require 8 or 9 external pins on the memory module that could otherwise be used for other functions or eliminated to reduce the cost of the memory module, at least in applications where data masking is not required. It should also be noted that the required number of data masking signals increases as the width of the data bus of the memory modules increases, at least if masking at the byte level is to be maintained.

There is a need for reducing the number of pins and cost of memory modules and of DRAMs forming such memory modules, and for reducing the frequency of applications where pins on the memory module and DRAMs go unutilized.

SUMMARY OF THE INVENTION

According to one aspect of the present invention, a method of masking data being written to a memory device having a data bus includes applying masking data on the data bus, storing the masking data in the memory device, applying write data on the data bus, storing the write data in the memory device, and applying the stored masking data to mask the stored write data.

According to another aspect of the present invention, a read/write circuit receives data words and data masking words applied on a data bus and receives read data from a memory-cell array. The read/write circuit operates during a read mode to apply read data received from the array on the data bus. During a write-partial mode, the read/write circuit stores at least one data masking word and at least one data word applied on the data bus, and applies each data masking word to mask each data word, and thereafter applies each masked data word to the memory-cell array.

DETAILED DESCRIPTION OF THE INVENTION

Figure 2:
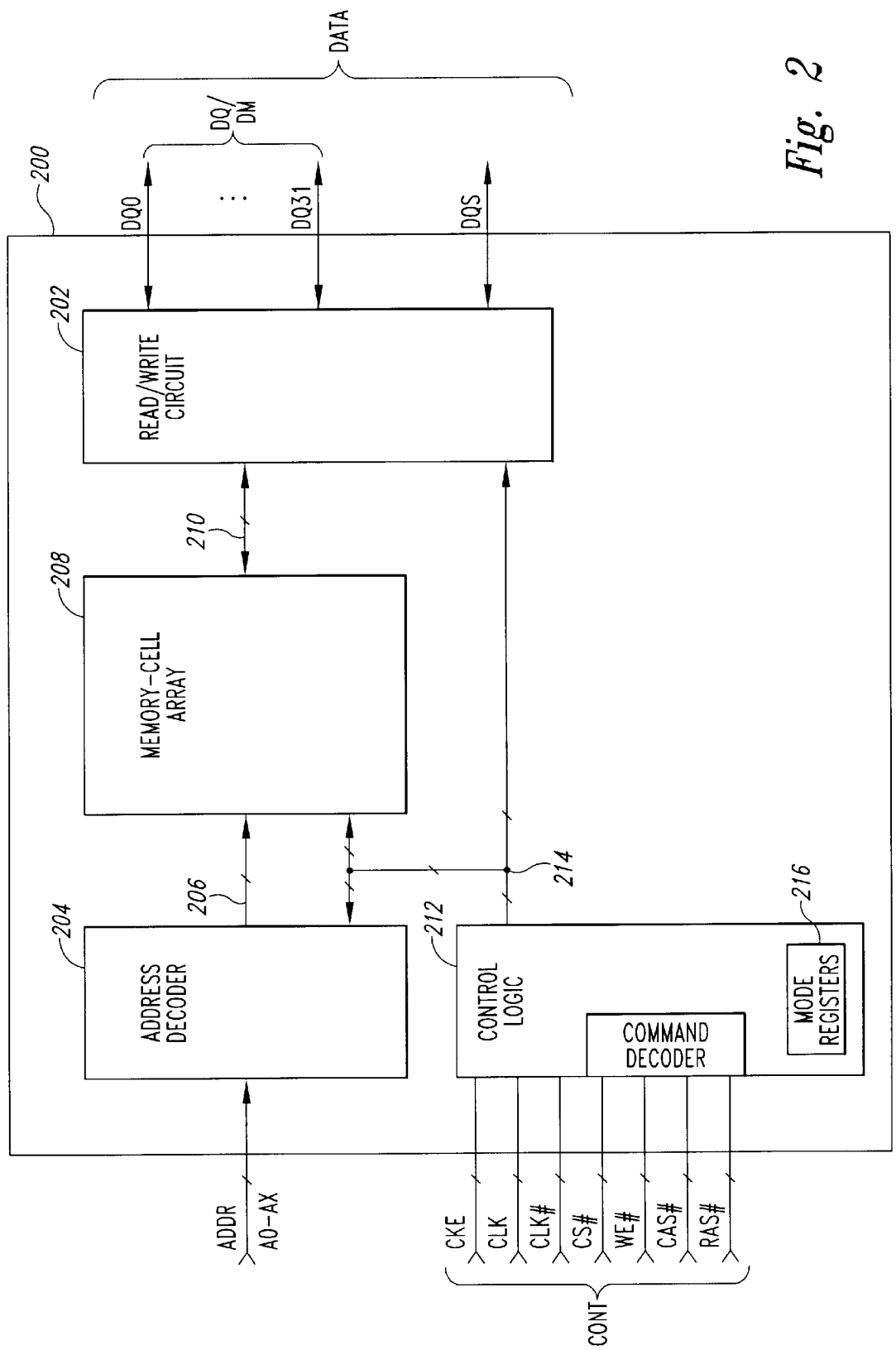
FIG. 2 is a functional block diagram of a memory device including a data masking circuit according to one embodiment of the present invention.

FIG. 2 is a functional block diagram of a memory 200 that receives data bits DQ0–31 and data masking bits DM0–31 over a data bus DATA and a read/write circuit 202 that applies the data masking words to mask data in the data words, as will be explained in more detail below. With the memory 200, no external data masking pins are required, thus reducing the number of pins and cost of the memory or allowing pins formerly required for data masking signals to be used for other purposes. In the simplified block diagram of FIG. 2, the memory 200 is a DDR SDRAM, although, as previously mentioned, the principles described herein are applicable to any memory device requiring the capability of masking data being written to the memory, such as conventional asynchronous DRAMs and synchronous DRAMs (SDRAMs), as well as packetized memory devices like SLDRAMs and RDRAMs, and are equally applicable to any integrated circuit requiring data masking capability. In the following description, certain details are set forth to provide a sufficient understanding of the present invention, but one skilled in the art will appreciate that the invention may be practiced without these particular details. In other instances below, the operation of well known components have not been shown or described in detail to avoid unnecessarily obscuring the present invention.

Figure 1:
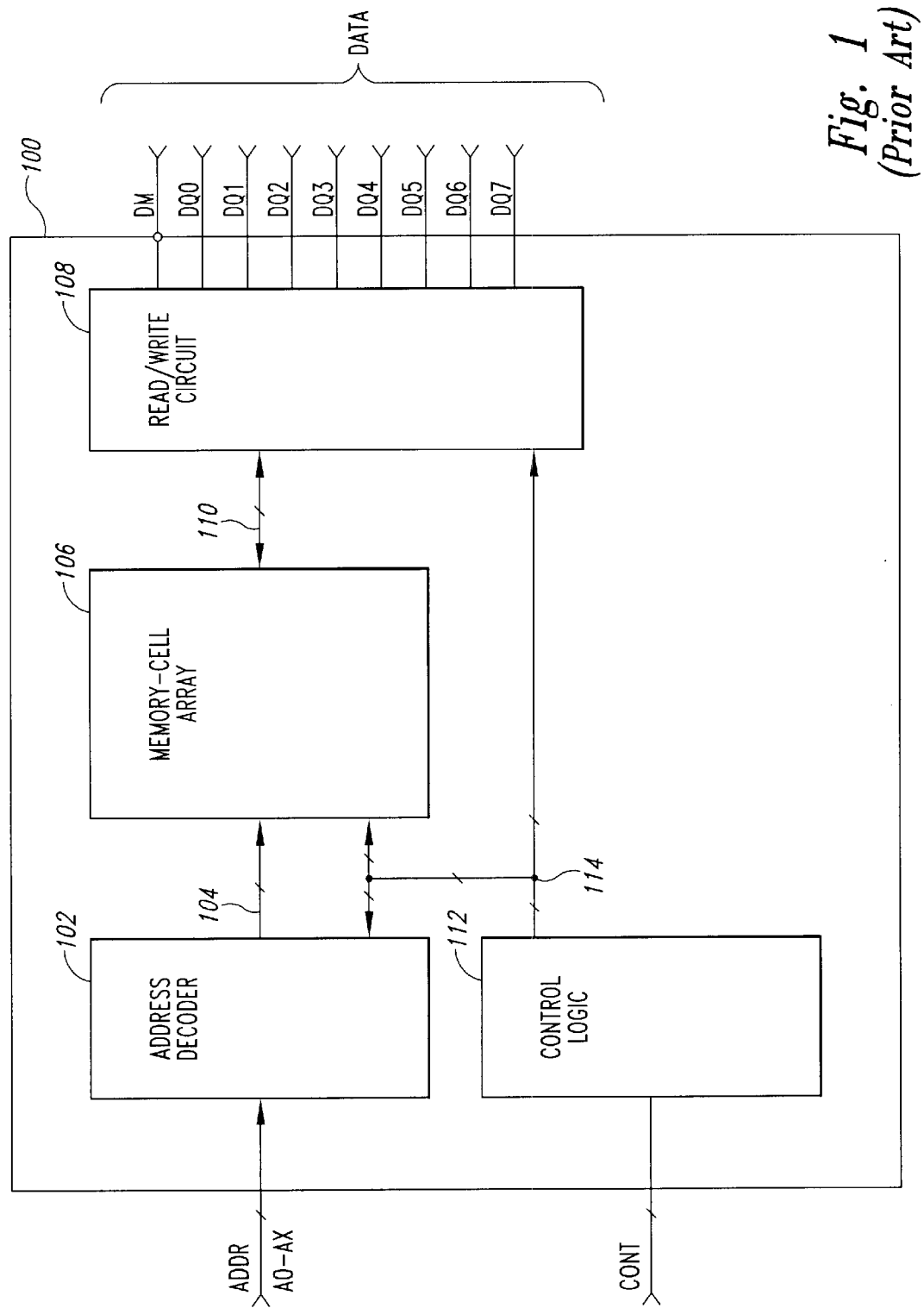
FIG. 1 is a functional block diagram of a conventional memory device including external data masking inputs to allow bytes of write data to be masked.

The memory 200 includes an address decoder 204 that receives address bits A0–AX on an address bus ADDR and decodes these address bits and applies decoded address signals 206 to a memory-cell array 208. The memory-cell array 208 includes a plurality of memory cells (not shown) arranged in rows and columns, each memory cell storing a bit of data. The data stored in the memory cells is accessed in response to the decoded address signals 206 from the address decoder 204. The read/write circuit 202 is coupled to the memory-cell array 208 through an internal data path 210 and is coupled to an external data bus DATA of the DRAM 200. The data bus DATA includes 32 external terminals over which respective data bits DQ0–31 are transferred to and from the DRAM 200 and also includes a data strobe signal DQS. The read/write circuit 202 outputs the DQS signal during read operations to allow an external controller (not shown), such as a memory controller, to capture read data bits DQ0–31 in response to the DQS signal. During write operations, the read/write circuit 202 receives the DQS signal from the external controller and latches write data bits DQ0–31 in response to the DQS signal. As indicated in FIG. 1, the read/write circuit 202 also receives data masking bits DM0–31 over the data bus DATA. During write partial operations, the read/write circuit 202 receives the data masking bits DM0–31 and applies the data masking words to mask write data bits DQ0–31 being stored in the memory-cell array 208, as will be discussed in more detail below.

The memory 200 further includes a control logic and command decoder 212 that receives a plurality of control and clocking signals over a control bus CONT, typically from the external controller (not shown). The control signals include a chip select signal CS#, a write enable signal WE#, a column address strobe signal CAS#, and a row address strobe signal RAS#, while the clocking signals include a clock enable signal CKE# and complementary clock signals CLK, CLK#, with the "#" designating a signal as being active low. The external controller drives the control signals CS#, WE#, CAS#, and RAS# to particular states and supplies the corresponding address signals A0–AX on the address bus ADDR to apply a command to the memory 200, such as a read, write, write partial, or load mode register command. As previously mentioned, the write partial command will be described in more detail below. The CKE signal enables clocking of the control logic and command decoder 212 by the clock signals CLK, CLK# and is utilized during self refresh operation of the memory 200. The control logic and command decoder 212 also includes mode registers 216 that store information to define specific modes of operation of the memory device 900, such as the selection of a burst length, burst type, and CAS latency.

In response to the clock signals CLK, CLK#, the control logic and command decoder 212 latches and decodes the control signals portion of an applied command, and generates a sequence of clocking and control signals 214 that control the components 204–210 to execute the function of the applied command. The control logic and command decoder 212 latches control signals and the address decoder 204 latches address signals A0–AX signals at positive edges of the CLK, CLK* signals (i.e., the crossing point of CLK going high and CLK# going low). The read/write circuit 202 outputs read data bits DQ0–31 and latches write data bits DQ0–31 in response to both edges of the data strobe signal DQS, which as the same frequency as the CLK, CLK# signals. Thus, read data DQ0–31 and write data DQ0–31 is transferred from and to the memory 200 at double the frequency of the clock signals CLK, CLK*. The memory 200 is therefore referred to as a double-data-rate device because the data bits DQ0–31 being transferred to and from the memory are transferred at double the rate at which commands are latched and at double the rate of a conventional SDRAM, which transfers data at a rate corresponding to the frequency of the applied clock signal.

In operation, the external controller applies address, control, and data signals to the memory 200 over the address bus ADDR, control bus CONT, and data bus DATA, respectively, to control the operation of the memory. The memory 200 operates in the same way as previously described for the conventional DRAM 100 of FIG. 1 during read and standard write operations. Briefly, during read operations, the external controller applies a read command to the memory 200 in the form of appropriate address signals on the address bus ADDR and control signals on the control bus CONT. The address decoder 204 latches and decodes the applied address signals and applies decoded address signals 206 to accesses addressed memory cells in the memory-cell array 208. The read data stored in the addressed memory cells is transferred over the internal data path 210 to the read/write circuit 202 which, in turn, places the read data on the data bus DATA as read data bits DQ0–31. The control logic and command decoder 212 generates the appropriate clocking and control signals 214 to control the address decoder 204, memory-cell array 208, and read/write circuit 202 during the read operation.

During standard write operations, the external circuit applies a write command to the memory 200 in the form of appropriate address signals and control signals on the ADDR and CONT buses, respectively, and also applies write data bits DQ0–31 and DQS signal on the data bus DATA. Once again, in response to the applied address signals, the address decoder 204 accesses the addressed memory cells in the memory-cell array 208. The read/write circuit 202 latches the applied write data bits DQ0–31 in response to the DQS signal, and transfers the latched write data words over the internal data path 210 to the addressed memory cells in the memory-cell array 208. Once again, the control logic and command decoder 212 generates the appropriate clocking and control signals 214 to control the address decoder 204, memory-cell array 208, and read/write circuit 202 during the standard write operation.

The memory 200 also operates in a write partial mode during which masking data is applied to the memory over the data bus DATA in the form of data masking bits DM0–31. The operation of the memory 200 during the write partial mode will now be described in more detail with reference to FIG. 2 and with reference to the signal timing diagram of FIG. 3 which illustrates a write partial cycle of the memory. To initiate a write partial mode, the external controller applies a write-partial command to the memory 200. The write-partial command includes appropriate address signals A0–AX on the address bus ADDR and appropriate control signals on the control bus CONT to define the write-partial command. The memory 200 latches the applied write-partial command at a time T0 in response to the rising-edge of the CLK signal. The address decoder 204 operates as previously described to decode the latched address and access address memory cells in the memory-cell array. In response to the latched write-partial command, the control logic and command decoder 212 generates the appropriate clocking and control signals 214 to control the address decoder 204, memory-cell array 208, and read/write circuit 202.

The external controller thereafter applies a data masking bits DM0–31 on the data bus DATA, and the read/write circuit 202 latches the applied data masking word in response to a rising-edge of the DQS signal at a time T1. At the time T1 and at subsequent rising-edges of the CLK signal, the external controller applies a no operation NOP or other suitable command to the memory 200, which continues processing the initially applied write-partial command. The data masking bits DM0–31 latched by the read/write circuit 202 contains masking data for a sequence of write data words DW0–7 that are applied on the data bus DATA following the data masking word. Each write data word DW0–7 is a merely a write data bits DQ0–31, with the notation DW0–7 being used merely to identify specific write data words during the write-partial mode of operation. The read/write circuit 202 latches the DW0 word at a time T2, the DW1 word at a time T3, and thereafter sequentially latches the DW2–6 words and the DW7 word at a time T4, each write data word being latched in response to a respective rising-or falling-edge of the DQS signal. In the write-partial cycle example of FIG. 3, the data masking bits DM0–31 contains 32 masking bits, one masking bit for a corresponding byte in one of the following eight write data words DW0–7. Each write data word DW0–7 contains 32 bits or four bytes of data, and the total number of bytes in the DW0–7 words is 32. Thus, each byte in the DW0–7 words is associated with a respective masking bit in the data masking bits DM0–31.

To complete the write-partial cycle, the read/write circuit 202 masks selected bytes of data in the DW0–7 words using the data masking bits DM0–31, and thereafter transfers the write data over the internal data path 210 to the memory-cell array to thereby store the data in the addressed memory cells in the array. When a particular data masking bit is set, the read/write circuit 202 masks the byte in the DW0–7 word associated with the masking bit, meaning the byte is not written into or is "masked" from the corresponding addressed memory cells in the array 208. In contrast, when a particular data masking bit is not set, the read/write circuit 202 transfers the byte of data in the DW0–7 word associated with the masking bit into the corresponding addressed memory cells in the array 208. The clocking and control signals 214 from the control logic and command decoder 212 place the read/write circuit 202 in the write-partial mode of operation, causing the read/write circuit to treat the first latched data word as containing masking data, and to apply the masking data to bytes in the subsequently latched write data words DW0–7. The read/write circuit 202 can begin masking the write data words DW0–7 as these words are sequentially latched, and need not wait until all write data words have been latched before starting the masking. This is true because in the embodiment of FIG. 2, once the DM0–31 word is latched the read/write circuit 202 has the masking data for all write data words DW0–7, and thus can apply the bits corresponding to each write data word when the word is latched and in advance of subsequent write data words being latched.

Through the write-partial mode of operation, the memory 200 provides data masking functionality without the requirement for external pins dedicated to receiving data masking signals. The memory 200 multiplexes data masking information and write data over the data bus DATA, eliminating the need for these dedicated external masking pins. This either allows the data masking pins of the memory 200 or terminals on a memory module containing a plurality of memories 200 to be eliminated, which reduces the cost of manufacturing the memory or memory module, or allows the pins to be used for other purposes to enhance the functionality to the memory 200. The memory 200 can be used in any type of application, such as system memory in a personal computer or handheld device, or in video applications. Applications requiring infrequent use of data masking are particularly suited to the memory 200 since the transfer the data masking bits DM0–31 does consume bandwidth of the data bus DATA. In the embodiment of the memory 200 described with reference to FIGS. 2 and 3, the DM0–31 words consume one-eighth (12.5%) of the available bandwidth, and thus this consumption would need to be taken into account when considering actual data throughput required in applications requiring frequent data masking, like video applications.

Figure 3:
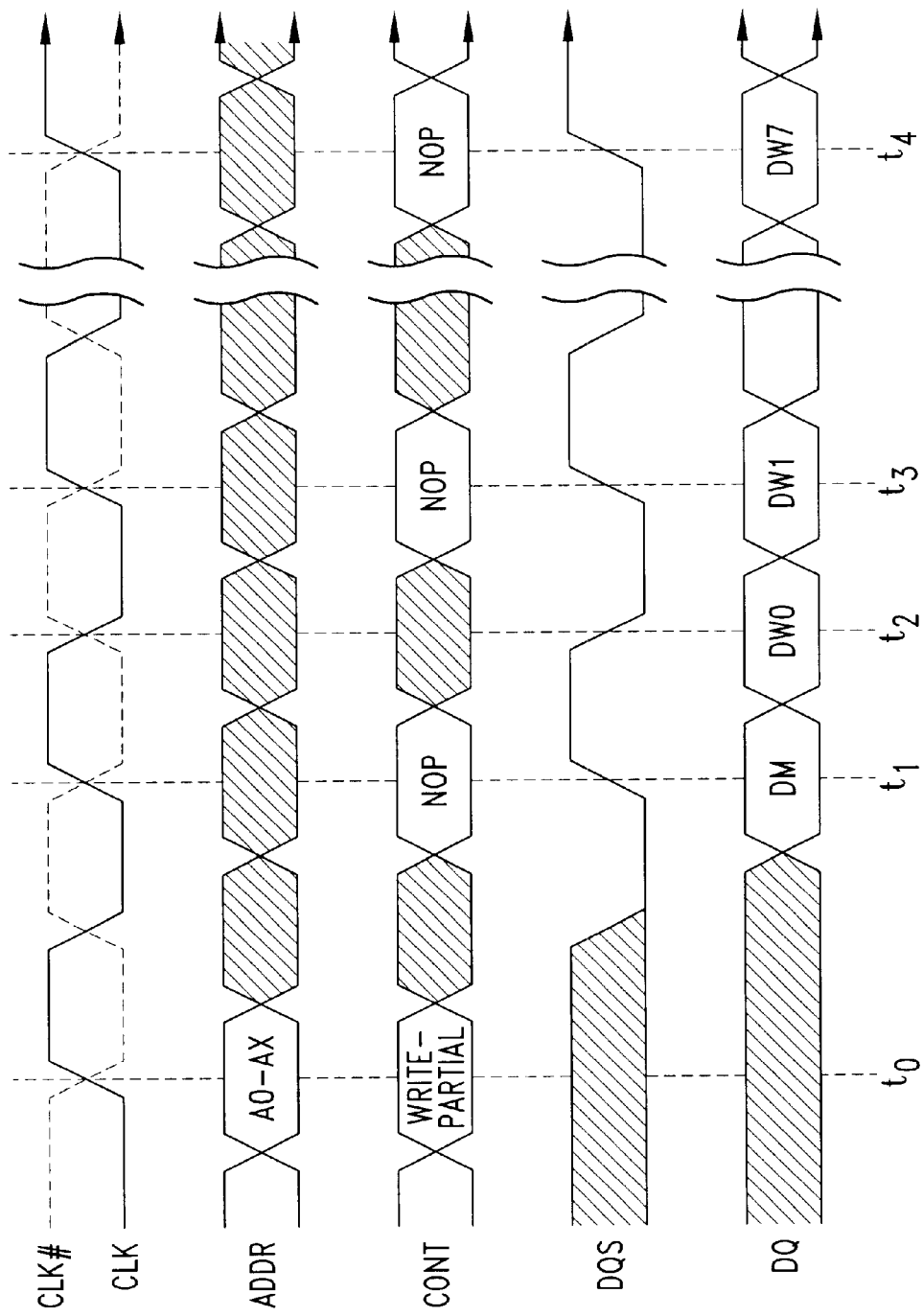
FIG. 3 is a signal timing diagram illustrating the operation of the memory device of FIG. 2 during a write partial operation in which data and data masking information are supplied to the memory device over a data bus of the memory device.

The embodiment of the memory 200 described with reference to FIGS. 2 and 3 has been provided by way of example, and one skilled in the art will appreciate that the present invention is not limited thereto. Those of ordinary skill in the art have sufficient understanding to modify the previously described embodiment to implement other embodiments of the present invention. For example, the burst length of the write-partial mode can, of course, be varied from the described burst length of eight words DW0–7, where the burst length is the number of data write words DW transferred each cycle. As previously mentioned, burst length is set by storing burst information the mode registers 216. Similarly, the data masking bits DM0–31 need not be the first word transferred each cycle, but instead could be the last word transferred or could be transferred somewhere in between, such as the fourth data word of each cycle.

In the memory 200, the number of data masking bits DM0–31 each cycle also could be varied, with two or more data masking word being transferred each cycle. Each data masking word also could include both masking data and write data, and need not include only masking data as in the example of FIG. 2. For example, where the burst length is set to 4, only four write data words DW0–31 would be transferred each cycle. In this situation, only four bytes per data word times four data words equals 16 bytes is transferred each cycle, meaning the masking word DM need only include 16 masking bits. In this situation, the masking bits DM0–31 includes 32 bits, so 16 of those bits or two bytes are unused. One additional byte of data could be included in the DM0–31 word, with the masking bit for this additional byte being stored in the other unused byte.

In the memory 200, the functionality for performing masking during write-partial operations is described as being done by the read/write circuit 202, but one skilled in the art will appreciate that this functionality could be incorporated into one of the other circuit blocks, or alternatively, may be split among several circuit blocks. The particular arrangement of the masking functionality within a memory may be a matter of design preference. Finally, as previously mentioned, the write-partial mode of operation can be used in other types of memories and other types of integrated circuits.

Figure 4:
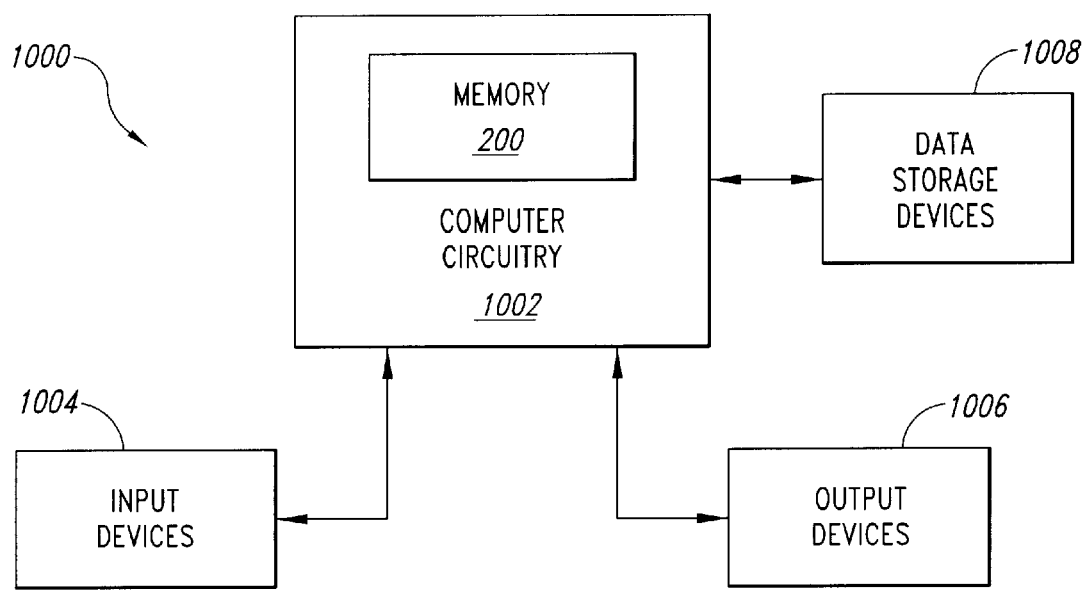
FIG. 4 is a functional block diagram of a computer system including the memory device of FIG. 3.

FIG. 4 is a functional block diagram of a computer system 1000 including computer circuitry 1002 that includes the memory 200 of FIG. 2. Typically, the computer circuitry 1002 is coupled through address, data, and control buses to the memory 200 to provide for writing data to and reading data from the memory. The computer circuitry 1002 includes circuitry for performing various computing functions, such as executing specific software to perform specific calculations or tasks, and may include devices for transferring data to and from the memory 200, such as memory controllers (not shown). In addition, the computer system 1000 includes one or more input devices 1004, such as a keyboard or a mouse, coupled to the computer circuitry 1002 to allow an operator to interface with the computer system. Typically, the computer system 1000 also includes one or more output devices 1006 coupled to the computer circuitry 1002, such output devices typically including a printer and a video terminal. One or more data storage devices 1008 are also typically coupled to the computer circuitry 1002 to store data or retrieve data from external storage media (not shown). Examples of typical storage devices 1008 include hard and floppy disks, tape cassettes, compact disk read-only (CD-ROMs) and compact disk read-write (CD-RW) memories, and digital video disks (DVDs).

Even though various embodiments and advantages of the present invention have been set forth in the foregoing description, the above disclosure is illustrative only, and changes may be made in detail and yet remain within the broad aspects of the invention. Therefore, the present invention is to be limited only by the appended claims.

What is claimed is:

1. A method of masking data being written to a memory device, the memory device including a data bus, the method comprising:

applying masking data on the data bus;
storing the masking data in the memory device;
applying as write data a burst of data words sequentially applied on the data bus;
storing the write data in the memory device; and
applying the stored masking data to mask the stored write data.

2. The method of claim 1 wherein applying masking data on the data bus and storing the masking data in the memory device occur before applying write data on the data bus and storing the write data in the memory device.

3. The method of claim 1 wherein all data words in the burst are stored in the memory device prior to applying the stored masking data to mask the stored data words.

4. The method of claim 1 wherein all data words in the burst are stored in the memory device prior to applying the masking data on the data bus and storing the masking data in the memory device.

5. The method of claim 1 wherein applying masking data on the data bus and storing the masking data in the memory device occur before applying the burst of write data words on the data bus.

6. The method of claim 1 wherein a portion of the data words in the burst are applied on the data bus and stored in the memory device prior to applying the masking data on the data bus and storing the masking data in the memory device, and wherein the remainder of the data words in the burst are applied on the data bus and stored in the memory device after the masking data is applied on the data bus and stored in the memory device.

7. The method of claim 1 wherein the burst comprises eight data words and the stored masking data comprises a byte of masking data, each bit in the byte being the masking data for a corresponding one of the eight data words in the burst.

8. The method of claim 1 wherein applying masking data on the data bus comprises applying a single data word on the data bus.

9. A method of transferring masking data to a memory device having a data bus, the method comprising applying masking data on the data bus, storing the masking data in the memory device, and applying as write data a burst of data words sequentially applied on the data bus, the stored masking data for masking the write data.

10. The method of claim 9 wherein the masking data comprises a single word applied on the data bus.

11. The method of claim 9 wherein applying masking data on the data bus and storing the masking data in the memory device occur prior to transferring write data associated with the masking data to the memory device.

12. A method of masking data being transferred to a memory device, the memory device including a data bus, and the method comprising:
applying a sequence of data words on the data bus;
storing the sequence of data words in the memory device;
identifying at least one of the data words as being a data word containing masking data; and
applying the masking data in each identified data word to mask the data in the other data words.

13. The method of claim 12 wherein one data word in the sequence includes the masking data.

14. The method of claim 12 wherein all data words in the sequence are stored in the memory device prior to the operations of identifying at least one of the data words and applying the masking data in each identified data word.

15. The method of claim 12 wherein a portion of the data words in the sequence are applied on the data bus and stored in the memory device prior to the operations of identifying at least one of the data words and applying the masking data in each identified data word, and wherein the remainder of the data words in the sequence are applied on the data bus and stored in the memory device after the operations of identifying at least one of the data words and applying the masking data in each identified data word.

16. The method of claim 12 wherein the sequence of data words comprises nine data words, each data word being a byte and one data word corresponding to the masking data, each bit in the byte being the masking data for a corresponding one of the other eight data words.

17. The method of claim 12 wherein each data word in the sequence comprises masking data and write data.

18. A method of masking data being written to a memory device, the memory device including data, control, and address busses, and the method comprising:
applying a write partial command to the memory device over the control and address busses;
applying a sequence of data words on the data bus;
storing the sequence of data words in the memory device;
decoding the applied write partial command;
in response to the decoded write partial command,
identifying at least one of the data words as being a data word containing masking data;
applying the masking data in each identified data word to mask the data in the other data words; and
storing the masked data in addressed memory cells in the memory device.

19. The method of claim 18 wherein one data word in the sequence includes the masking data.

20. The method of claim 18 wherein all data words in the sequence are stored in the memory device prior to the operations of identifying at least one of the data words and applying the masking data in each identified data word.

21. The method of claim 18 wherein a portion of the data words in the sequence are applied on the data bus and stored in the memory device prior to the operations of identifying at least one of the data words and applying the masking data in each identified data word, and wherein the remainder of the data words in the sequence are applied on the data bus and stored in the memory device after the operations of identifying at least one of the data words and applying the masking data in each identified data word.

22. The method of claim 18 wherein the sequence of data words comprises nine data words, each data word being a byte and one data word corresponding to the masking data, each bit in the byte being the masking data for a corresponding one of the other eight data words.

23. The method of claim 18 wherein each data word in the sequence comprises masking data and write data.

24. A read/write circuit adapted to receive data words and data masking words applied on a data bus and adapted to receive read data from a memory-cell array, the read/write circuit operable during a read mode to apply read data received from the array on the data bus, and operable during a write-partial mode to store at least one data masking word and at least one data word applied on the data bus, and operable to apply each data masking word to mask each data word and to thereafter apply each masked data word to the memory-cell array.

25. The read/write circuit of claim 24 wherein the data masking word includes masking data for masking and not masking corresponding segments of data contained in the data words.

26. The read/write circuit of claim 25 wherein each segment comprises a byte of data.

27. The read/write circuit of claim 24 wherein the read/write circuit receives all data masking words prior to receiving the data words.

28. The read/write circuit of claim 24 wherein the read/write circuit is further operable during a write mode to receive and store data words over the data bus and apply the data words to the memory-cell array.

29. The read/write circuit of claim 24 wherein the data words comprise a burst of data words sequentially applied on the data bus and the data masking word comprises a single data masking word.

30. The read/write circuit of claim 29 wherein all data words in the burst are stored in read/write circuit prior to the read/write circuit applying the data masking word to mask the data words.

31. The read/write circuit of claim 24 wherein the read/write circuit stores a portion of the data words in the burst prior to storing the data masking word, and wherein the read/write circuit stores the remainder of the data words in the burst after storing the data masking word.

32. The read/write circuit of claim 24 wherein the received at least one data masking word and data word comprise a single word including masking data and write data to be masked.

33. A read/write circuit adapted to receive data words and data masking words applied on a data bus and adapted to receive read data from a memory-cell array, the read/write circuit operable during a read mode to apply read data received from the array on the data bus, and operable during a write mode to store data words applied on the data bus and apply the data words to the memory-cell array, and operable during a write-partial mode to store at least one data masking word and at least one data word applied on the data bus, and operable to apply masking data contained in each data masking word to selectively mask and not mask data contained in each data word, and to thereafter apply the masked and not masked data to the memory-cell array.

34. The read/write circuit of claim 33 wherein the data masking word includes masking data for masking and not masking corresponding segments of data contained in the data words.

35. The read/write circuit of claim 34 wherein each segment comprises a byte of data.

36. The read/write circuit of claim 33 wherein the read/write circuit receives all data masking words prior to receiving the data words.

37. The read/write circuit of claim 33 wherein the data words comprise a burst of data words sequentially applied on the data bus and the data masking word comprises a single data masking word.

38. The read/write circuit of claim 37 wherein during the write-partial mode of operation all data words in the burst are stored in read/write circuit prior to the read/write circuit applying the data masking word to mask the data words.

39. The read/write circuit of claim 37 wherein the read/write circuit stores a portion of the data words in the burst prior to storing the data masking word, and wherein the read/write circuit stores the remainder of the data words in the burst after storing the data masking word.

40. A memory device, comprising:
   an address bus;
   a control bus;
   a data bus;
   an address decoder coupled to the address bus;
   a control circuit coupled to the control bus;
   a memory-cell array coupled to the address decoder and control circuit;
   a read/write circuit coupled to the data bus and the memory-cell array, the read/write circuit operable during a read mode to apply read data received from the memory-cell array on the data bus, and operable during a write-partial mode to receive at least one data masking word and at least one data word applied on the data bus and store the received words, and operable to apply each data masking word to mask each data word and to thereafter apply each masked data word to the memory-cell array.

41. The memory device of claim 40 wherein the memory comprises a double-data rate synchronous dynamic random access memory.

42. The memory device of claim 40 wherein the read/write circuit receives all data masking words prior to receiving the data words.

43. The memory device of claim 40 wherein the data words comprise a burst of data words sequentially applied on the data bus and the data masking word comprises a single data masking word.

44. The memory device of claim 43 wherein all data words in the burst are stored in the read/write circuit prior to the read/write circuit applying the data masking word to mask the data words.

45. The memory device of claim 43 wherein the read/write circuit stores a portion of the data words in the burst prior to storing the data masking word, and wherein the read/write circuit stores the remainder of the data words in the burst after storing the data masking word.

46. The memory device of claim 43 wherein the received at least one data masking word and data word comprise a single word including masking data and write data to be masked.

47. A computer system, comprising:
   a data input device;
   a data output device;
   a processor coupled to the data input and output devices; and
   a memory device coupled to the processor, the memory device comprising,
      an address bus;
      a control bus;
      a data bus;
      an address decoder coupled to the address bus;
      a control circuit coupled to the control bus;
      a memory-cell array coupled to the address decoder and control circuit;
      a read/write circuit coupled to the data bus and the memory-cell array, the read/write circuit operable during a read mode to apply read data received from the memory-cell array on the data bus, and operable during a write-partial mode to receive at least one data masking word and at least one data word applied on the data bus and store the received words, and operable to apply each data masking word to mask each data word and to thereafter apply each masked data word to the memory-cell array.

48. The computer system of claim 47 wherein the memory comprises a double-data rate synchronous dynamic random access memory.

49. The computer system of claim 47 wherein the read/write circuit receives all data masking words prior to receiving the data words.

50. The computer system of claim 47 wherein the data words comprise a burst of data words sequentially applied on the data bus and the data masking word comprises a single data masking word.

51. The computer system of claim 50 wherein all data words in the burst are stored in the read/write circuit prior to the read/write circuit applying the data masking word to mask the data words.

52. The computer system of claim 50 wherein the read/write circuit stores a portion of the data words in the burst prior to storing the data masking word, and wherein the read/write circuit stores the remainder of the data words in the burst after storing the data masking word.

53. The computer system of claim 50 wherein the received at least one data masking word and data word comprise a single word including masking data and write data to be masked.

* * * * *